United States Patent
Hayashi et al.

(10) Patent No.: US 8,835,761 B2
(45) Date of Patent: Sep. 16, 2014

(54) SEALING STRUCTURE

(75) Inventors: Takahiro Hayashi, Fujisawa (JP); Makoto Hora, Fujisawa (JP); Keiichi Miyajima, Fujisawa (JP)

(73) Assignee: NOK Corporation (JP)

( * ) Notice: Subject to any disclaimer, the term of this patent is extended or adjusted under 35 U.S.C. 154(b) by 562 days.

(21) Appl. No.: 12/602,979

(22) PCT Filed: Mar. 7, 2008

(86) PCT No.: PCT/JP2008/054692
§ 371 (c)(1),
(2), (4) Date: Dec. 3, 2009

(87) PCT Pub. No.: WO2009/041086
PCT Pub. Date: Apr. 2, 2009

(65) Prior Publication Data
US 2010/0181089 A1   Jul. 22, 2010

(30) Foreign Application Priority Data

Sep. 26, 2007   (JP) ................. 2007-248845

(51) Int. Cl.
H01J 5/00 (2006.01)
H01J 15/00 (2006.01)
H05K 5/06 (2006.01)
H05K 1/00 (2006.01)
H05K 1/02 (2006.01)

(52) U.S. Cl.
CPC ...... *H05K 1/028* (2013.01); *H05K 2201/09663* (2013.01); *H05K 2203/1147* (2013.01)
USPC .......... 174/50.5; 174/50.6; 174/254

(58) Field of Classification Search
CPC ...... H05K 5/06; F01N 13/1877; H01B 17/30; H01L 23/02; F16L 17/035; F16J 15/00; F16J 15/02; F16J 15/04; F16J 15/0887; F16J 15/104

USPC ....... 174/17.07, 17.08, 26 R, 50.5, 50.6, 504, 174/506, 151, 50.56, 564, 50.58; 439/587
See application file for complete search history.

(56) References Cited

U.S. PATENT DOCUMENTS

| 3,546,543 | A | * | 12/1970 | Hessinger | 174/564 |
| 4,636,581 | A | * | 1/1987 | Roche et al. | 174/152 R |
| 5,491,300 | A | * | 2/1996 | Huppenthal et al. | 174/564 |
| 2006/0032653 | A1 | * | 2/2006 | Minoshima et al. | 174/52.3 |
| 2008/0233783 | A1 | * | 9/2008 | Jacobson | 439/271 |

FOREIGN PATENT DOCUMENTS

JP   S57-164734 U   10/1982
JP   H1-143186 U   10/1989

(Continued)

OTHER PUBLICATIONS

Definition of "vicinity" from www.merriam-webster.com Mar. 11, 2014.*

*Primary Examiner* — Chau N Nguyen
*Assistant Examiner* — Roshn Varghese
(74) *Attorney, Agent, or Firm* — Harness, Dickey & Pierce, P.L.C.

(57) ABSTRACT

To minimize thermal influence when integrally forming the sealing member on a flexible wiring board, a sealing structure includes a housing, a flexible wiring board inserted therethrough, and a sealing member integrally formed with the flexible wiring board to airtightly seal a gap between the housing and the flexible wiring board, the flexible wiring board includes a base substrate made of an elastic material, an electrically conductive printed wiring layer formed on a surface of the base substrate, and a cover film covering a surface of the printed wiring layer, and the printed wiring layer which crosses the sealing member is formed as a plurality of divided print wiring layers at only a crossing region with the sealing member and its vicinity.

14 Claims, 6 Drawing Sheets

(56) References Cited

FOREIGN PATENT DOCUMENTS

| JP | 04-024983 A | 1/1992 |
| JP | 2003-142836 A | 5/2003 |
| JP | 2004-214927 A | 7/2004 |
| JP | 2006-344813 A | 12/2006 |

* cited by examiner

SEALING STRUCTURE

CROSS-REFERENCE TO RELATED APPLICATIONS

This is a national stage of the International Application No. PCT/JP2008/054692 filed on Mar. 7, 2008 and published in Japanese language.

BACKGROUND OF THE INVENTION

1. Field of the Invention

The present invention relates to a sealing structure. More particularly, the present invention relates to a sealing structure providing waterproof function for electric devices and connectors.

2. Description of the Conventional Art

Recently, waterproof connectors used in an electric device such as a mobile phone or the like and a wire harness used in an automobile or the like have been miniaturized and high waterproof function has been required at the same time.

In order to provide waterproof function for an electric device having a plurality of spaces therein, it is necessary to airtightly seal respective housings that define individual spaces and to connect electrically devices in the respective spaces by means of flexible wiring boards or the like.

In this case, there has been proposed a way that terminals are provided on the wall surfaces of the housings defining the spaces and the terminals are connected by the wiring materials, or another way that the wiring materials are extended through the walls of the housings and the gaps produced between the wiring materials and the housings are filled with an adhesive agent or the like.

However, the former structure of providing the terminals on the wall surfaces of the housings has a problem that the equipment becomes larger in size, and the latter structure of filling the gaps produced between the wiring materials and the housings with the adhesive agent or the like has a problem that disassembly and reassembly is difficult.

Consequently, there has been proposed another structure of forming sealing members integrally with a flexible wiring board as shown in FIGS. 7 and 8 (Japanese unexamined patent publication Nos. 2003-142836 and 2004-214927).

FIG. 7 shows a structure in which sealing members 301 having frame shapes corresponding to the shape of respective housings (not shown) are formed integrally with a flexible wiring board 100. The flexible wiring board 100 extends through the respective sealing members 301, and electric devices are mounted in regions surrounded by respective seal members 301.

Further, FIG. 8 shows another structure in which sealing members 303 having a bush shape are formed integrally with a flexible wiring board 100. The sealing members 303 are attached to an insertion holes provided in respective housings (not shown), and connectors 304 provided at both ends of the flexible wiring board 100 are electrically connected to the electric devices in the housings.

Further, there has been proposed still another structure as shown in FIG. 4, in combination of the structures shown in FIGS. 7 and 8, in which a frame-shaped seal 31 and a bush-shaped seal 32 are integrally formed at one side and the other side of the flexible wiring board 1 respectively.

However, the below mentioned problems arises as shown in FIGS. 5 and 6 which are sectional views taken along lines A-A in FIG. 4.

The flexible wiring board 1 is normally provided with the following structure. A printed wiring layer 12 (circuit pattern) made from a copper foil is bonded fixedly to one surface of a base substrate 11. The base substrate 11 is made of an elastic material such as polyimide, polyamide, polyester, liquid crystal polymer or the like. Further, a cover film 13 is formed on the surface of printed wiring layer 12 to protect the surface thereof. The cover film 13 is formed from the same material as the elastic material used for the base substrate 11. Thus, the printed wiring layer 12 is structured so as to be sandwiched between the base substrate 11 and the cover film 13. Further, molding pressure and heating are needed when the seal member 3 is integrally formed on the flexible wiring board 1. As a result, there arises a problem that the printed wiring layer 12 as shown in FIG. 5 comes under thermal influence and is deformed as shown in FIG. 6. Consequently, the seal member 3 also comes under thermal influence, and the sealing capability is lowered at that portion. As a result, the bonding between the housing and the sealing member 3 cannot work successfully, thereby causing leakage.

SUMMARY OF THE INVENTION

Problem to be Solved by the Invention

In view of the above problem, it is an object of the present invention to provide a sealing structure for excellently sealing between a housing and a sealing member by suppressing thermal influence as much as possible at the time of integrally forming the sealing member with a flexible wiring board.

Means for Solving the Problem

The above object of the present invention is achieved by providing a sealing structure which includes a housing, a flexible wiring board penetrating through the housing, and a sealing member formed integrally with the flexible wiring board and provided to airtightly seal a gap defined between the housing and the flexible wiring board. The flexible wiring board includes a base substrate made of an elastic material, an electrically conductive printed wiring layer formed on a surface of the base substrate, and a cover film covering a surface of the printed wiring layer. The printed wiring layer, which crosses the sealing member, is formed as a plurality of divided print wiring layers at only a crossing region with the sealing member and its vicinity.

Effect of the Invention

The present invention has the following advantages.

In accordance with a first aspect of the present invention, there is provided a sealing structure, which is capable of minimizing the thermal influence given on the flexible wiring board at the time of integrally forming the sealing member with the flexible wiring board, thereby to suppress deformation of the flexible wiring board.

Further, in accordance with a second aspect of the present invention, there is provided a sealing structure, which is capable of reducing the thermal influence on the entire printed wiring layer.

Further, in accordance with a third aspect of the present invention, there is provided a sealing structure, which is capable of preventing thermal deformation of the entire region of the printed wiring layer where it comes under the thermal influence.

Further, in accordance with a fourth aspect of the present invention, there is provided a sealing structure, which can effectively make thermal dispersion of the divided print wiring layers, thereby to reduce thermal influence on the entire printed wiring layer.

Further, in accordance with a fifth aspect of the present invention, there is provided a sealing structure, which can prevent deterioration of performance of the printed wiring layer.

Further, in accordance with a sixth aspect of the present invention, there is provided a sealing structure, which can be used for various purposes.

Further, in accordance with a seventh aspect of the present invention, there is provided a sealing structure, which is capable of enhancing waterproof function of the entire region including the mating faces of the housing.

Further, in accordance with an eighth aspect of the present invention, there is provided a sealing structure, which is capable of making surer sealing between the insertion hole provided in the housing and the flexible wiring board.

Further, in accordance with a ninth aspect of the present invention, there is provided a sealing structure, which is compatible for the various shapes of housings.

DETAILED DESCRIPTION OF PREFERRED EMBODIMENTS

Preferred embodiments of the present invention will be described below.

The embodiments of the present invention will be described below with reference to FIGS. 1 to 4.

Figure 1:
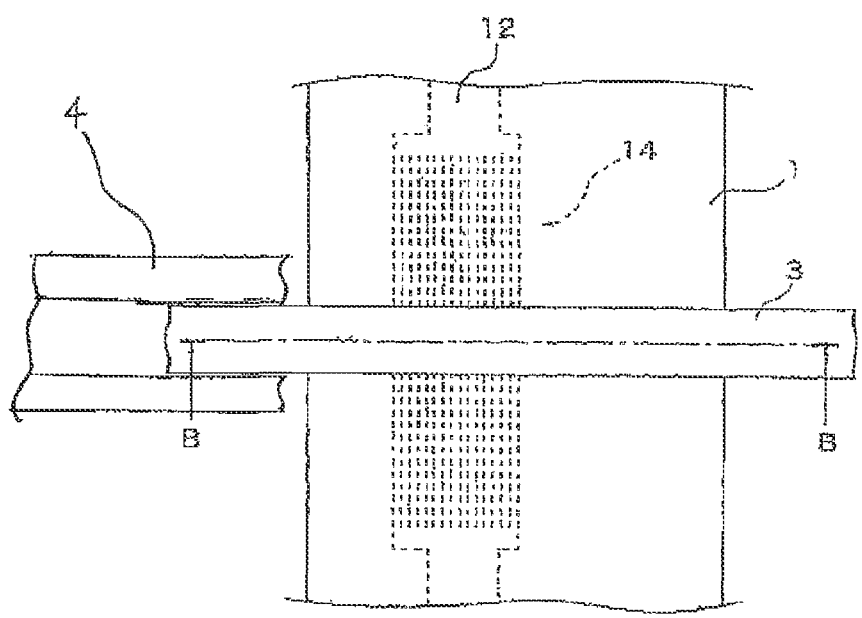
FIG. 1 is a plan view partially illustrating a first embodiment of the sealing structure in accordance with the present invention.
Figure 2:
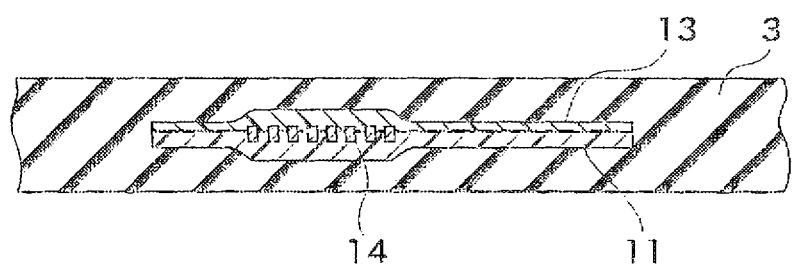
FIG. 2 is a sectional view taken along lines B-B in FIG. 1.

FIG. 1 is a plan view partially illustrating a first embodiment of the sealing structure in accordance with the present invention, and FIG. 2 is a sectional view taken along lines B-B in FIG. 1.

Figure 3:
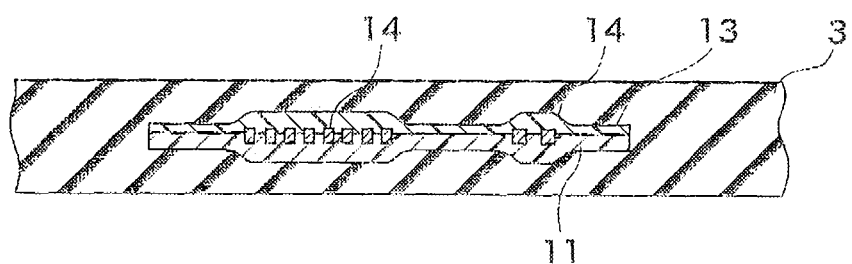
FIG. 3 is a sectional view, similarly to FIG. 2, illustrating a second embodiment of the sealing structure in accordance with the present invention.

Further, FIG. 3 is a sectional view, similarly to FIG. 2, illustrating a second embodiment of the sealing structure in accordance with the present invention.

Figure 5:
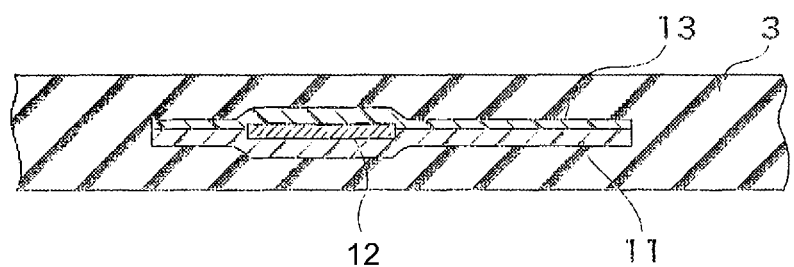
FIG. 5 is a sectional view taken along lines A-A in FIG. 4.
Figure 6:
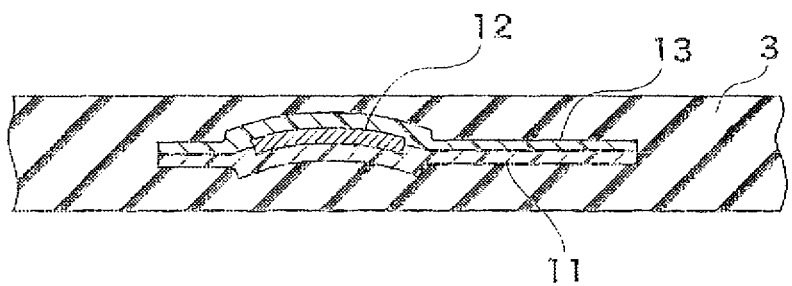
FIG. 6 is a sectional view illustrating the state when the sealing structure shown in FIG. 5 comes under thermal influence.
Figure 7:
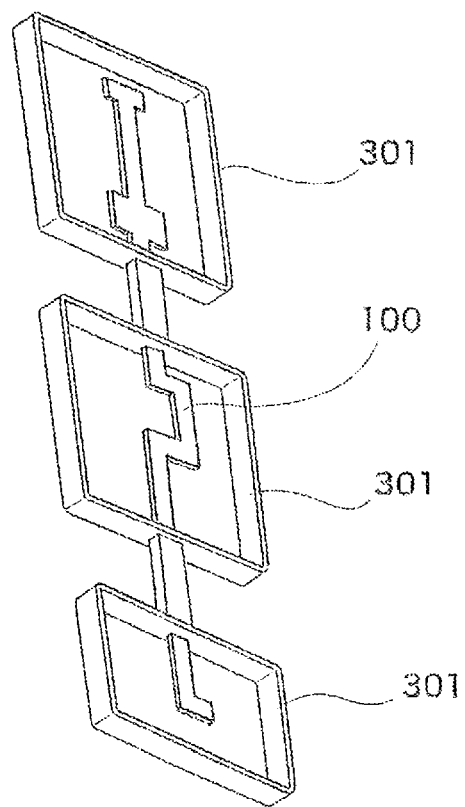
FIG. 7 is a plan view illustrating another conventional sealing structure.
Figure 8:
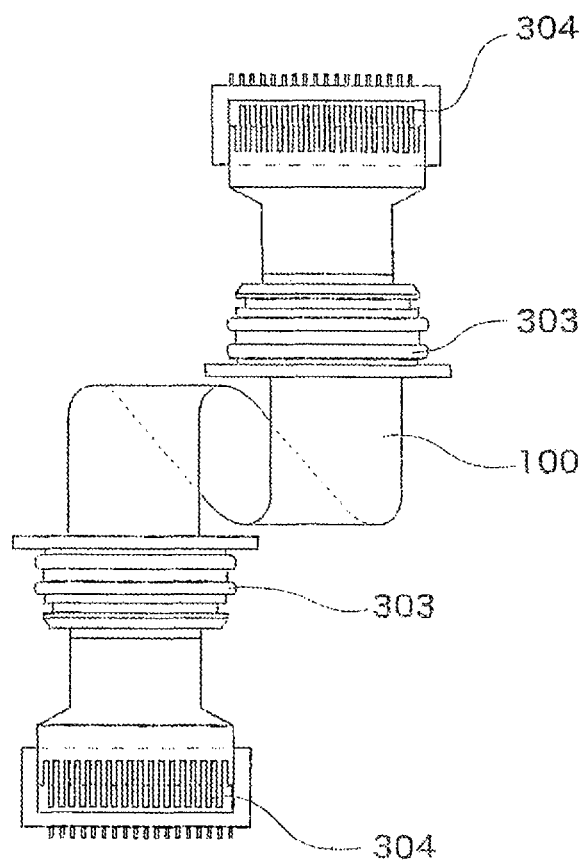
FIG. 8 is a plan view illustrating still another conventional sealing structure.

FIG. 2 illustrates a same part with a same section as the conventional sealing structure shown in FIG. 5.

Figure 4:
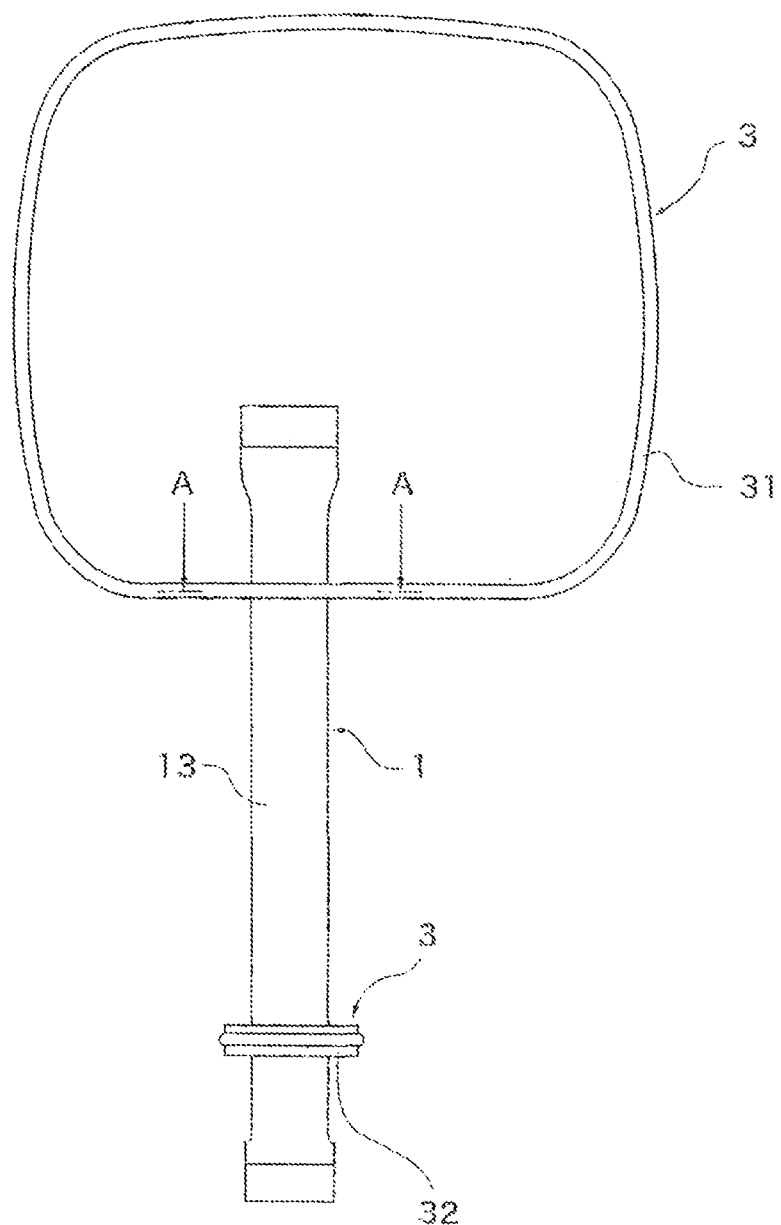
FIG. 4 is a plan view illustrating a conventional sealing structure.

In FIG. 4, sealing members 3 and 3 with different shapes are integrally formed on a flexible wiring board 1 near the respective ends thereof. The sealing member 3 shown at the upper side in the figure is formed as a frame-shaped seal 31 to simultaneously seal a gap between the housings and a gap between the housing 4 and the flexible wiring board 1, while the sealing member 3 shown at the lower side in the figure is formed as a bush-shaped seal 32 to seal a gap between the insertion hole provided in the housing 4 and the flexible wiring board 1.

Further, the flexible wiring board 1 is provided with the following structure. The flexible wiring board 1 includes a base substrate 11 formed from an elastic material such as polyimide, polyamide, polyester, liquid crystal polymer or the like, and a printed wiring layer 12 formed from copper foil, which is bonded fixedly onto one surface of the base substrate 11.

Further, there is provided a cover film 13 on the printed wiring layer 12 to protect its surface.

The cover film 13 is formed from the same material as the elastic material used in the base substrate 11.

Thus, the printed wiring layer 12 is structured so as to be sandwiched between the base substrate 11 and the cover film 13.

Further, as shown in FIG. 1, one printed wiring layer 12 is equally divided into eight divided print wiring layers 14 at a region where the sealing member 3 crosses the flexible wiring board 1. And the divided print wiring layers 14 exist in the entire region where it comes under the thermal influence when the sealing member 3 is integrally formed with the flexible wiring board 1.

Specifically, it is preferable that the divided print wiring layers 14 exist at least in a broader region than a contact region of a molding metal die.

Further, it is preferable for the purpose of maintaining the performance of the flexible wiring board 1 that a sectional area of the printed wiring layer 12 is substantially the same as the total sectional area of the divided print wiring layers 14.

Next, the second embodiment of the present invention will be described with reference to FIG. 3.

The difference in this embodiment from the first embodiment is that two printed wiring layers 12 are provided, and the respective printed wiring layers 12 are equally divided to be two batches of divided print wiring layers 14, 14. Other points are the same as the first embodiment.

Further, the sealing members 3, 3 are formed from a rubber-like elastic material such as acrylic rubber, fluororubber, EPDM or the like, and it is preferable to use self-adhesive liquid rubber.

The frame-shaped seal 31 or the bush-shaped seal 32 is integrally formed on the flexible wiring board 1 through baking by means of molding metal die.

Both the seal member 3, 3 seal a gap between the mating faces of the housings and a gap between the insertion hole provided in the housing and the flexible wiring board 1 respectively.

The flexible wiring board 1 may be the one with multilayered structure, and in particular, the present invention can be applied effectively to the flexible wiring board with multilayered structure.

The housing may be a frame body of a mobile phone or a connector housing.

Further, the sealing member 3 may have various shapes other than those of the frame-shaped seal 31 and the bush-shaped seal 32.

Further, in the above embodiments, there are provided two seal members 3 on the flexible wiring board 1, but the number of the members is not limited to two, and three or more can be provided corresponding to the structure of device to which the invention is applied.

Further, the present invention is not limited in scope to the preferred embodiments of the present invention mentioned above, and may be modified to various configurations without departing the scope of the present invention.

INDUSTRIAL APPLICABILITY

The present invention may be used in electric devices such as a mobile phone or the like, or a wire harness used in an automobile or the like.

What is claimed is:

1. A sealing structure comprising:
   a housing;
   a flexible wiring board penetrating through the housing; and
   a sealing member bonded to said flexible wiring board so as to be integral therewith, and provided to airtightly seal a gap between said housing and said flexible wiring board,
   wherein said flexible wiring board includes:
      a base substrate made of an elastic material;
      an electrically conductive printed wiring layer formed on a surface of said base substrate; and
      a cover film covering a surface of said printed wiring layer,
   wherein said flexible wiring board includes a region which comes under thermal influence when said seal member is integrally bonded to said flexible wiring board,
   wherein said printed wiring layer, which crosses said sealing member, is formed as a first single printed wiring layer that is divided direct into a plurality of divided print wiring layers that are recombined directly into a second single printed wiring layer,
   wherein each of the plurality of divided wiring layers is electrically connected to the first and second single printed wring layers, and
   wherein the divided print wiring layers are only provided in an entirety of the region which comes under the thermal influence, and the region includes a crossing region with said sealing member.

2. The sealing structure as claimed in claim 1, wherein a plurality of said printed wiring layers are provided, and each of the printed wiring layers is formed as a plurality of divided print wiring layers.

3. The sealing structure as claimed in claim 2, wherein said divided print wiring layers are divided equally.

4. The sealing structure as claimed in claim 2, wherein the total sectional area of said divided print wiring layers is substantially the same as that of said printed wiring layer.

5. The sealing structure as claimed in claim 2, wherein said flexible wiring board has a multilayered structure.

6. The sealing structure as claimed in claim 2, wherein said sealing member is formed as a frame-shaped seal to simultaneously seal a gap between the housing and a gap between the housing and the flexible wiring board.

7. The sealing structure as claimed in claim 2, wherein said sealing member is formed as a bush-shaped seal to seal a gap between an insertion hole provided in said housing and the flexible wiring board.

8. The sealing structure as claimed in claim 2, wherein said sealing member is formed in a combined structure of a frame-shaped seal to simultaneously seal a gap between the housings and a gap between the housing and the flexible wiring board and a bush-shaped seal to seal a gap between an insertion hole provided in said housing and the flexible wiring board.

9. The sealing structure as claimed in claim 1, wherein said divided print wiring layers are divided equally.

10. The sealing structure as claimed in claim 1, wherein the total sectional area of said divided print wiring layers is substantially the same as that of said printed wiring layer.

11. The sealing structure as claimed in claim 1, wherein said flexible wiring board has a multilayered structure.

12. The sealing structure as claimed in claim 1, wherein said sealing member is formed as a frame-shaped seal to simultaneously seal a gap between the housing and a gap between the housing and the flexible wiring board.

13. The sealing structure as claimed in claim 1, wherein said sealing member is formed as a bush-shaped seal to seal a gap between an insertion hole provided in said housing and the flexible wiring board.

14. The sealing structure as claimed in claim 1, wherein said sealing member is formed in a combined structure of a frame-shaped seal to simultaneously seal a gap between the housing and a gap between the housing and the flexible wiring board and a bush-shaped seal to seal a gap between an insertion hole provided in said housing and the flexible wiring board.

* * * * *